(12) United States Patent
Molev Shteiman et al.

(10) Patent No.: US 9,979,445 B2
(45) Date of Patent: May 22, 2018

(54) DIGITAL TO ANALOG CONVERTER APPARATUS, SYSTEM, AND METHOD WITH QUANTIZATION NOISE THAT IS INDEPENDENT OF AN INPUT SIGNAL

(71) Applicant: Futurewei Technologies, Inc., Plano, TX (US)

(72) Inventors: Arkady Molev Shteiman, Basking Ridge, NJ (US); Xiao-Feng Qi, Westfield, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days. days.

(21) Appl. No.: 15/212,151

(22) Filed: Jul. 15, 2016

(65) Prior Publication Data
US 2018/0019791 A1  Jan. 18, 2018

(51) Int. Cl.
*H03M 1/08*    (2006.01)
*H04B 7/04*    (2017.01)
*H04B 7/08*    (2006.01)

(52) U.S. Cl.
CPC ........ *H04B 7/0421* (2013.01); *H03M 1/0854* (2013.01); *H04B 7/0842* (2013.01)

(58) Field of Classification Search
CPC .. H03M 1/0854; H04B 7/0842; H04B 7/0421
See application file for complete search history.

(56) References Cited

U.S. PATENT DOCUMENTS

| | | | | |
|---|---|---|---|---|
| 3,790,768 A | * | 2/1974 | Chevalier | G06F 7/584 331/78 |
| 4,467,316 A | * | 8/1984 | Musmann | H03M 1/72 341/144 |
| 5,793,798 A | * | 8/1998 | Rudish | G01S 7/023 375/130 |
| 6,252,464 B1 | * | 6/2001 | Richards | H03C 3/0941 327/107 |
| 6,259,747 B1 | * | 7/2001 | Gustafsson | H04L 27/2071 332/103 |
| 6,459,398 B1 | * | 10/2002 | Gureshnik | H03M 7/3008 341/144 |
| 6,894,972 B1 | * | 5/2005 | Phaal | H04L 43/065 370/229 |
| 7,176,817 B2 | | 2/2007 | Jensen | |

(Continued)

FOREIGN PATENT DOCUMENTS

CN    102714503 A    10/2012
WO    2007079097 A2   7/2007

OTHER PUBLICATIONS

Derwent—2011-J83270.*

(Continued)

*Primary Examiner* — Jean B Corrielus
(74) *Attorney, Agent, or Firm* — Zilka-Kotab, PC

(57) ABSTRACT

An apparatus, system, and method are provided for affording digital to analog converter (DAC) quantization noise that is independent of an input signal. In operation, an input signal for a DAC is received. Further, a particular signal is added to the input signal for the DAC, such that an output signal of the DAC includes quantization noise that is independent of the input signal (e.g. includes white noise, etc.), as a result of the particular signal being added to the input signal for the DAC.

19 Claims, 12 Drawing Sheets

(56) References Cited

U.S. PATENT DOCUMENTS

| | | | | |
|---|---|---|---|---|
| 7,187,314 | B1* | 3/2007 | Beamish | H03M 1/007 341/144 |
| 7,215,267 | B1* | 5/2007 | Johnston | H03M 3/328 341/131 |
| 7,821,434 | B2* | 10/2010 | Huppertz | H03M 3/384 341/117 |
| 8,160,187 | B1* | 4/2012 | Turner | H04B 3/32 375/260 |
| 8,385,385 | B2* | 2/2013 | Michaels | H04L 9/001 375/141 |
| 8,634,512 | B2* | 1/2014 | Leung | H03C 3/0941 327/156 |
| 8,666,343 | B2* | 3/2014 | Shanan | H04B 1/30 455/226.1 |
| 9,204,215 | B2* | 12/2015 | Fraisse | H04R 3/00 |
| 2003/0153360 | A1* | 8/2003 | Burke | H04B 7/0626 455/562.1 |
| 2007/0253468 | A1* | 11/2007 | Pettersen | H04B 1/0483 375/146 |
| 2012/0188107 | A1 | 7/2012 | Ashburn, Jr. et al. | |
| 2015/0229323 | A1 | 8/2015 | Kinyua | |
| 2016/0094923 | A1* | 3/2016 | Jensen | H04R 25/75 600/28 |
| 2016/0182136 | A1* | 6/2016 | Zhang | H04B 7/0465 370/329 |
| 2017/0034841 | A1* | 2/2017 | Bethanabhotla | H04W 28/08 |

OTHER PUBLICATIONS

Sherwood, D. T. et al., "Quantization Noise Effects in the Complex LMS Adaptive Algorithm—Linearization Using Dither," IEEE, 1985, pp. 1735-1738.

Chono, K. et al., "In-loop noise shaping based on pseudo noise injection and Wiener filtering," MMSP, 2011, pp. 1-6.

Wagdy, M. F., "Effect of Various Dither Forms on Quantization Errors of Ideal ND Converters," IEEE Transactions on Instrumentation and Measurement, vol. 38, No. 4, Aug. 1989, pp. 850-855.

Rohde & Schwarz, "Lte System Specifications and their Impact on Re & Base Band Circuits," Application Note, Apr. 2013—1MA221_1E, 2013, pp. 1-37.

International Search Report from PCT Application No. PCT/CN2017/091658, dated Sep. 28, 2017.

* cited by examiner

INPUT SIGNAL AND 3 BITS CONVENTIONAL QUANTIZER

INPUT SIGNAL AND 3 BITS RANDOM QUANTIZER

3 BITS QUANTIZATION NOISE POWER SPECTRUM

8 BITS QUANTIZATION NOISE POWER SPECTRUM

3 BITS QUANTIZATION NOISE POWER SPECTRUM

3 BITS QUANTIZATION NOISE POWER SPECTRUM

DAC QUANTIZATION EVM, ANTNUMB=8

DAC QUANTIZATION EVM, ANTNUM = 8

DAC QUANTIZATION EVM, ANTNUM = 32

MASSIVE MIMO QUANTIZATION NOISE
RADIATION POWER

DIGITAL TO ANALOG CONVERTER
APPARATUS, SYSTEM, AND METHOD WITH
QUANTIZATION NOISE THAT IS
INDEPENDENT OF AN INPUT SIGNAL

FIELD OF THE INVENTION

The present invention relates to converters, and more particularly to digital-to-analog converters (DACs).

BACKGROUND

Converters and, in particular, digital-to-analog converters (DACs) typically exhibit some amount of quantization noise. Such quantization noise is a result of, among other things, a difference between an input value and a corresponding quantized value (e.g. round-off, truncation, etc. error), that is often referred to as quantization error. In most systems, such quantization noise may be filtered using traditional techniques such as filtering, averaging, etc. However, in situations where the DAC has a low resolution and/or is the subject of high oversampling [e.g. such as in massive multiple-input-multiple-output (MIMO)-capable systems, etc.], such traditional techniques for addressing quantization noise unfortunately are less optimum or even fail.

SUMMARY

A method is provided for affording digital to analog converter (DAC) quantization noise that is independent of an input signal. In operation, an input signal for the DAC is received. The input signal is combined with a particular signal. Further, the combined signal is transmitted to the DAC. To this end, an output signal is output from the DAC that includes quantization noise that is independent of the input signal.

An apparatus is also provided for affording DAC quantization noise that is independent of an input signal. Included is a combiner that receives an input signal and combines the input signal with a particular signal. Further, a DAC is coupled to the combiner. The DAC receives the combined signal from the combiner and outputs an output signal. Such output signal comprises a quantization noise that is independent of the input signal.

Still yet, a multiple-input-multiple-output (MIMO) system is provided including a plurality of antennas supported by a plurality of supporting circuitry. Each of the supporting circuitry comprises a combiner that receives an input signal and combines the input signal with a particular signal. Further included is a DAC coupled to the combiner that receives the combined signal from the combiner and outputs an output signal. Such output signal comprises a quantization noise that is independent of the input signal.

In a first embodiment, the particular signal may be generated by a random signal generator.

In a second embodiment (which may or may not be combined with the first embodiment), the particular signal may be uniformly distributed.

In a third embodiment (which may or may not be combined with the first and/or second embodiments), the quantization noise may be independent, identically distributed (IID).

In a fourth embodiment (which may or may not be combined with the first, second, and/or third embodiments), the quantization noise may be random quantization noise.

In a fifth embodiment (which may or may not be combined with the first, second, third, and/or fourth embodiments), the quantization noise of the output signal of the DAC may be filtered.

In a sixth embodiment (which may or may not be combined with the first, second, third, fourth, and/or fifth embodiments), the DAC may be a single bit DAC.

In a seventh embodiment (which may or may not be combined with the first, second, third, fourth, fifth, and/or sixth embodiments), the combining may include adding or multiplying.

In an eighth embodiment (which may or may not be combined with the first, second, third, fourth, fifth, sixth, and/or seventh embodiments), a radio frequency transceiver may be coupled to the DAC for emitting a radio frequency signal based on the output signal.

In a ninth embodiment (which may or may not be combined with the first, second, third, fourth, fifth, sixth, seventh, and/or eighth embodiments), the DAC may be a component of a multiple-input-multiple-output (MIMO)-capable apparatus.

In a tenth embodiment (which may or may not be combined with the first, second, third, fourth, fifth, sixth, seventh, eighth, and/or ninth embodiments), the MIMO-capable apparatus may be a massive MIMO-capable apparatus.

In an eleventh embodiment (which may or may not be combined with the first, second, third, fourth, fifth, sixth, seventh, eighth, ninth, and/or tenth embodiments), the particular signal may be combined with the input signal, in connection with a plurality of antennas of the MIMO-capable apparatus. As an option, each particular signal that is combined in connection with the plurality of antennas of the MIMO-capable apparatus may be generated by a single generator. As a further option, each particular signal that is combined in connection with the plurality of antennas of the MIMO-capable apparatus may have a different phase.

In a thirteenth embodiment (which may or may not be combined with the first, second, third, fourth, fifth, sixth, seventh, eighth, ninth, tenth, eleventh, and/or twelfth embodiments), a steering module may be coupled to the combiner for controlling the combining of the input signal with the particular signal. As an option, an output of the steering module produces a signal characterized by the following equation:

$$\text{Steering}(m,\alpha) = \exp(j \cdot \pi m \cdot \sin(\alpha)), \text{ where:}$$

Steering(m, $\alpha$) is a steering function towards direction $\alpha$ at antenna m;
sin( ) is a sine function;
$\exp(j^*x) = \cos(x) + j^*\sin(x)$;
j is complex 1; and
$\alpha$ is a steering direction.

Further, the output signal may be characterized by the following equation:

$$y(m,n) = \text{DAC}_m(\text{Steering}(m,\alpha) \cdot x(n)), \text{ where:}$$

y(m, n) is a DAC m output signal at time n; and
x(n) is a signal sent towards direction $\alpha$.

To this end, in some optional embodiments, one or more of the foregoing features may be used to make DAC quantization noise independent of a DAC input signal which, in turn, may provide a variety of possible benefits. In one embodiment, DAC quantization noise in such form may facilitate the removal thereof, in a manner that would otherwise be less effective with the application of traditional techniques (e.g. filtering, averaging, etc.). For example, the DAC quantization noise may be uniformly distributed across all (or a substantial number of) frequencies and, therefore, out of band components of such noise may be filtered in the time domain. Further, in MIMO and massive-MIMO environments, the DAC quantization noise may be uniformly radiated in all (or a substantial number of) directions and, therefore, such noise may be filtered in the angular domain. This may, in turn, result in improved DAC performance that would otherwise be foregone in systems that lack such capability. For example, a conventional DAC does not necessarily distribute quantization error energy uniformly. Therefore, in a worst case, a large portion of such energy may fall into a specific frequency and/or direction, and therefore be problematic. It should be noted that the aforementioned potential advantages are set forth for illustrative purposes only and should not be construed as limiting in any manner.

DETAILED DESCRIPTION

Figure 1:
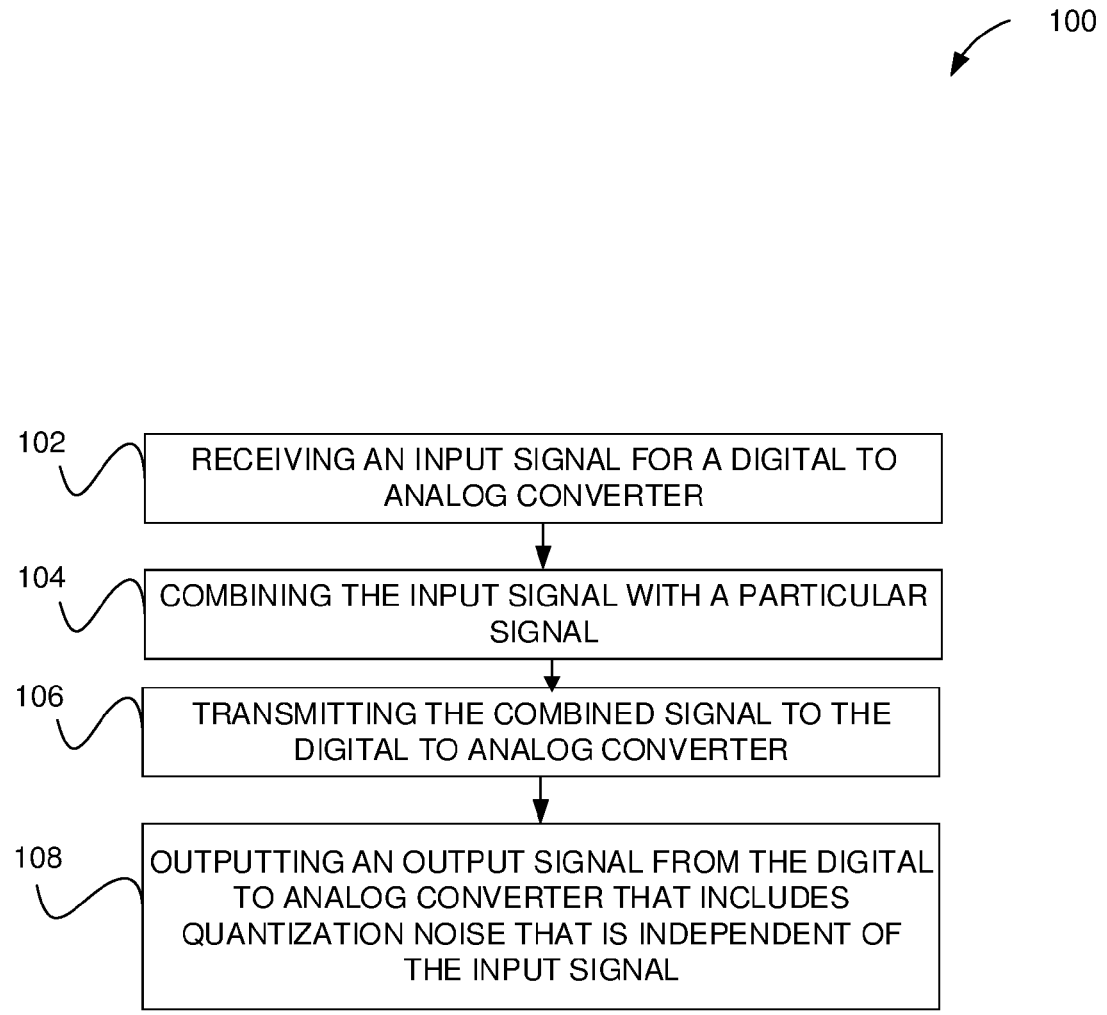
FIG. 1 illustrates a method for affording digital to analog converter (DAC) quantization noise that is independent of an input signal, in accordance with one embodiment.

FIG. 1 illustrates a method 100 for affording digital to analog converter (DAC) quantization noise that is independent of an input signal, in accordance with one embodiment. In the context of the present description, the DAC may refer to any circuit or component that converts a signal from a digital format to an analog format. In various embodiments, the DAC may be designed with any degree of precision (e.g. N-bit, where N=1, 2, 3, 4, 5, 6, 7, 8 . . . any integer, etc.). Further, in one embodiment, the DAC may be designed with a low degree of precision (e.g. M-bit, where M<8). Further, in different embodiments, the DAC may be the subject of high over sampling (e.g. hundreds, thousands, or more, etc.).

In the context of the present description, the quantization noise may include any noise that results from quantization error. As mentioned earlier, such quantization error may be a result of, among other things, a difference between an input value and a corresponding quantized value (e.g. round-off, truncated, etc. value, etc.). Still yet, in the context of the present description, the DAC quantization noise being independent of the input signal, may refer to any relationship whereby the DAC quantization noise is not a function of the input signal, or substantially not a function of the input signal to an extent that one or more advantages (to be described later) ensue, at least in part.

With reference to FIG. 1, an input signal for a DAC is received in operation 102. In the context of the present description, the input signal for the DAC may include any signal that: is input into the DAC, is input into any pre-DAC-processing stage prior to the DAC, and/or exists at any stage within the DAC (prior to the output signal). Further, the receipt may refer to any passive and/or active action (e.g. identification of, tap of, etc.) in connection with the input signal that allows another signal to be added, in a manner that will soon become apparent.

Further, in operation 104, a particular signal is combined with the input signal for the DAC. In the context of the present description, the particular signal may include any signal that results in the quantization noise being independent of the input signal. For example, in various embodiments, the particular signal may: include noise (e.g. white noise, etc.), be uniformly distributed, be randomized (at least in part), be independent of the input signal, etc. Further, the combining may refer to any addition, multiplication, and/or any other function, for that matter.

As indicated in operation 106, the combined signal is transmitted to the DAC. To this end, in operation 108, an output signal is output from the DAC, where the output signal includes quantization noise that is independent of the input signal. In the context of the present description, the output signal from the DAC may include any signal that: is output from the DAC, is output from any post-DAC-processing stage after the DAC, and/or exists at any stage within the DAC (downline from the input signal).

Thus, by adding the particular signal, as described above, the output signal of the DAC includes quantization noise that is independent of the input signal. For example, in one embodiment, the quantization noise may be independent, identically distributed (IID) (i.e. each random variable has a same probability distribution as others and is mutually independent, etc.). In another embodiment, the quantization noise may be white (i.e. contain many frequencies with equal or similar intensities, etc.). In yet another embodiment, the quantization noise may be uniformly distributed [e.g. exactly or substantially distributed uniformly across any parameter (e.g. frequency, angle, etc.)]. To this end, the quantization noise may be more effectively filtered, particularly in situations where traditional techniques (e.g. filtering, averaging, etc.) are ineffective.

In one possible embodiment, the quantization noise of the DAC output signal may be filtered. In the context of the present description, the filtering may refer to any process or technique (e.g. spatial filtering or any other type, etc.) that results in the removal (at least in part) of the quantization noise.

In another possible embodiment that will be elaborated upon later, the DAC may be a component of a multiple-input-multiple-output (MIMO)-capable apparatus. As an option, the particular signal may be added to the input signal for the DAC, in connection with a plurality of antennas of the MIMO-capable apparatus. Further, each particular signal that is added in connection with the plurality of antennas of the MIMO-capable apparatus may be generated by a single generator. Further, each particular signal that is added in connection with the plurality of antennas of the MIMO-capable apparatus may have a different phase, have a different seed, and/or be varied in any respect.

To this end, in some optional embodiments, one or more of the foregoing features may be used to make DAC quantization noise independent of a DAC input signal which, in turn, may provide a variety of possible benefits. In one embodiment, DAC quantization noise in such form may facilitate the removal thereof, in a manner that would otherwise be less effective with the application of traditional techniques (e.g. filtering, averaging, etc.). For example, the DAC quantization noise may be uniformly distributed across all (or a substantial number of) frequencies and, therefore, out of band components of such noise may be filtered in the time domain. Further, in MIMO and massive-MIMO environments, the DAC quantization noise may be uniformly radiated in all (or a substantial number of) directions and, therefore, such noise may be filtered in the angular domain. This may, in turn, result in improved DAC performance that would otherwise be foregone in systems that lack such capability. For example, a conventional DAC does not necessarily distribute quantization error energy uniformly. Therefore, in a worst case, a large portion of such energy may fall into a specific frequency and/or direction, and therefore be problematic. It should be noted that the aforementioned potential advantages are set forth for illustrative purposes only and should not be construed as limiting in any manner.

More illustrative information will now be set forth regarding various optional architectures and uses in which the foregoing method may or may not be implemented, per the desires of the user. It should be noted that the following information is set forth for illustrative purposes and should not be construed as limiting in any manner. Any of the following features may be optionally incorporated with or without the exclusion of other features described.

For example, in one embodiment, DAC quantization noise may be filtered, where such DAC quantization noise is defined as:

$$y(x) = \text{round}\left(\frac{x}{\Delta}\right) \qquad \text{Equation 1}$$

$$E_q = E\left[\left(y(x) - \left(\frac{x}{\Delta}\right)\right)^2\right] = \int_{x=x_{MIN}}^{x_{MAX}} \left(\text{round}\left(\frac{x}{\Delta}\right) - \left(\frac{x}{\Delta}\right)\right)^2 \cdot p(x) \cdot dx \qquad \text{Equation 2}$$

where:
x is a DAC input signal;
y is a DAC output signal;
$\Delta$ is DAC resolution (step);
q is DAC quantization noise;
p(x) is a probability density function (PDF) of input signal x;
dx is an integration over x;

$E_q$ is DAC quantization noise power; and
E[ ] is an expectation function.

It should be noted that, to the extent that any expressions are repeated in the following equations, their definition(s) are the same, unless indicated otherwise. Further, for reference purposes, the resultant DAC quantization noise power may be defined by the following Equations 3 and 4. If the DAC bit number is sufficiently large such that $\Delta$ is sufficiently small, it can be assumed that:

$$p(x) \approx p(x_o) \text{ for any } x \text{ within} \qquad \text{Equation 3}$$

$$\left(x_0 - \frac{\Delta}{2} \le x < x_o + \frac{\Delta}{2}\right) \text{ and for any } x_o = k \cdot \Delta,$$

then:
where:
p(x) is a probability density function (PDF) of input signal x;
$x_0$ is a product of any constant (k) with the DAC resolution (step) (e.g. k·$\Delta$); and
k is any integer number.

$$E_q = \int_{x=x_{MIN}}^{x_{MAX}} \left(\text{round}\left(\frac{x}{\Delta}\right) - \left(\frac{x}{\Delta}\right)\right)^2 \cdot p(x) \cdot dx \approx \qquad \text{Equation 4}$$

$$\int_{x=-\frac{\Delta}{2}}^{\frac{\Delta}{2}} x^2 \cdot \frac{1}{\Delta} \cdot dq = \frac{\Delta^2}{12}$$

In operation, DAC quantization noise is white if an input signal is white, and the following equation results:

$$q(n) = \left(\frac{x(n)}{\Delta}\right) - \text{round}\left(\frac{x(n)}{\Delta}\right) \qquad \text{Equation 5}$$

where:
n is the time index;
x(n) is the input signal at time sample n; and
q(n) is the quantization noise at time sample n.
Following is an example of Equation 5:

$$\text{if } (x(n) = const), \text{ then } q(n) = \left(\frac{const}{\Delta}\right) - \text{round}\left(\frac{const}{\Delta}\right) \qquad \text{Equation 6}$$

Figure 2:
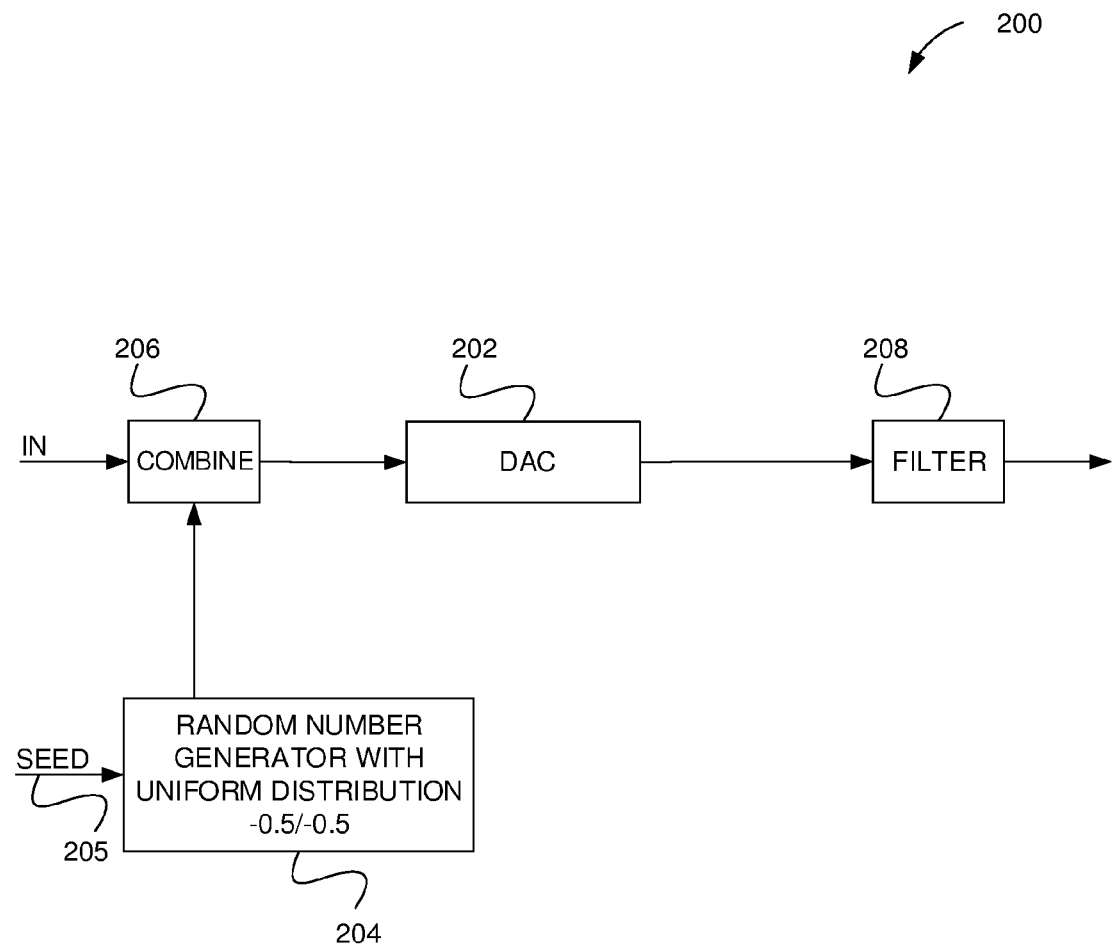
FIG. 2 illustrates a system for affording DAC quantization noise that is independent of an input signal, in accordance with one embodiment.

FIG. 2 illustrates a system 200 for affording DAC quantization noise that is independent of an input signal, in accordance with one embodiment. As an option, the system 200 may be implemented in the context of any one or more of the embodiments set forth in any previous and/or subsequent figure(s) and/or description thereof. For example, the system 200 may perform the method 100 of FIG. 1. However, it is to be appreciated that the system 200 may be implemented in the context of any desired environment.

As shown, a DAC 202 is provided. In one embodiment, the DAC 202 may include a regular DAC (without the other components shown). However, in other embodiments, the DAC 202 may incorporate/integrate any one or more of the other components. For example, in one embodiment, all of the components may be integrated in a single circuit.

Figure 3:
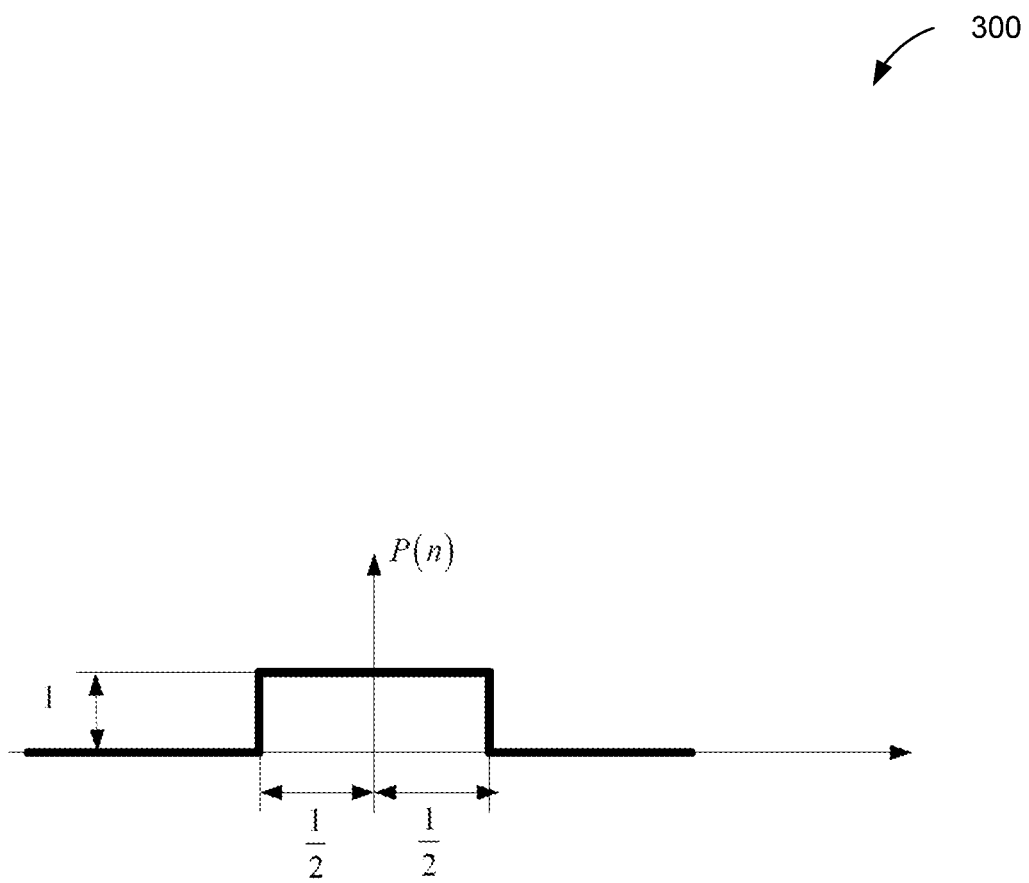
FIG. 3 illustrates one exemplary pulse of random signals.

Such other components are shown to include a random number generator 204 that generates random signals. In one embodiment, the random signals may exhibit a uniform distribution (e.g. Gaussian, etc.) and possibly be constrained within a predetermined magnitude range (−0.5/+0.5). FIG. 3 illustrates one exemplary pulse 300 of such random signals that is constrained within such predetermined magnitude range. To accomplish this, the random number generator 204 receives, as input, a seed 205, in the manner shown, and outputs the random signals to a combiner 206 (e.g. adder, etc.) that is in electrical communication (directly or indirectly) with the random number generator 204 and the DAC 202. In use, the random number generator 204 and combiner 206 serve to add the random signals to an input signal for the DAC 202.

Further included is a filter 208 that is in electrical communication (directly or indirectly) with the DAC 202 for filtering any quantization noise from an output of the DAC 202. More information will now be set forth regarding an operation of the various components of the system 200.

In one embodiment, an output of the DAC 202 (after the random signals are added via the combiner 206) may be characterized, as follows:

$$\begin{cases} \text{sign}(x) \cdot \text{fix}\left(\frac{|x|}{\Delta}\right) \text{with probability } P = 1 - \text{fractional}\left(\frac{|x|}{\Delta}\right) \\ \text{sign}(x) \cdot \text{ceil}\left(\frac{|x|}{\Delta}\right) \text{with probability } P = \text{fractional}\left(\frac{|x|}{\Delta}\right) \end{cases} \quad \text{Equation 7}$$

where:
x is a DAC input signal;
y is a DAC output signal;
$\Delta$ is a DAC step;
sign(x) is a sign function, where sign(x)=1 if x>0; sign(x)=0 if x=0; and sign(x)=−1 if x<0;
fix is a fix operation, where, for example: fix(5.7)=5 fix(−5.7)=−5;
ceil is an operation, where, for example: ceil(5.7)=6 ceil(−5.7)=−6;
fractional(fract) is an operation, where, for example: fract(5.7)=0.7 fract(−5.7)=−0.7.

In an example where x is 5.7, the above fix function will result in down-rounding (5) and the ceil function will result in up-rounding (6).

In any case, random DAC quantization noise of the DAC 202 may be defined as follows:

$$q(x) = y(x) - x = \quad \text{Equation 8}$$

$$\begin{cases} -\text{fractional}\left(\frac{|x|}{\Delta}\right) \text{with probability } P = 1 - \text{fractional}\left(\frac{|x|}{\Delta}\right) \\ 1 - \text{fractional}\left(\frac{|x|}{\Delta}\right) \text{with probability } P = \text{fractional}\left(\frac{|x|}{\Delta}\right) \end{cases}$$

Additionally, in one embodiment, random DAC quantization noise expectation in connection with the DAC 202 may be defined as follows:

$$E[(q(x)|x)] = \left(1 - \text{fractional}\left(\frac{|x|}{\Delta}\right)\right) \cdot \text{fractional}\left(\frac{|x|}{\Delta}\right) - \quad \text{Equation 9}$$

$$\text{fractional}\left(\frac{|x|}{\Delta}\right) \cdot \left(1 - \text{fractional}\left(\frac{|x|}{\Delta}\right)\right)$$

$$E[(q(x)|x)] = 0 \quad \text{Equation 10}$$

Equation 10 thus indicates that the expectation of quantization noise q(x) given x is equal to zero, thus proving that, for a random DAC as described herein, such expectation equals zero. As a result of Equation 10, the following equation consequently holds:

$$E[(y(x)|x)] = E\left[\left(\left(\frac{|x|}{\Delta} + q(x)\right)\middle| x\right)\right] = \frac{|x|}{\Delta} + E[(q(x)|x)] = \frac{|x|}{\Delta} \quad \text{Equation 11}$$

Thus, as established above, the random DAC quantization noise expectation is independent (e.g. not a function) of the input signal (to which the noise is added). In the case of a regular DAC where, with an input x of 5.7, there would be an expectation of an output of 6 and a quantization noise expectation of 0.3. In contrast, with the system 200 of FIG. 2 (given the same input x of 5.7), there would be an expectation of an output of 5.7 and a random DAC quantization noise expectation of zero (0), as indicated by Equation 10.

In one embodiment, random DAC quantization noise power may be defined as follows:

$$E[(q(x)^2|x)] = \text{fractional}\left(\frac{x}{\Delta}\right) \cdot \left(1 - \text{fractional}\left(\frac{|x|}{\Delta}\right)\right)^2 + \quad \text{Equation 12}$$

$$\left(1 - \text{fractional}\left(\frac{x}{\Delta}\right)\right) \cdot \text{fractional}\left(\frac{x}{\Delta}\right)^2$$

$$E_q = E[q(x)^2] = \int_{x=x_{MIN}}^{x_{MAX}} E[(q(x)^2|x)] \cdot p(x) \cdot dx \quad \text{Equation 13}$$

In one embodiment, random DAC quantization noise power may be defined by the following Equations 14 and 15. Specifically, if the DAC bit level is sufficiently large such that $\Delta$ is sufficiently small, it may be assumed that:

$$p(x) \approx p(x_o) \quad \text{Equation 14}$$

for any $x$ within $\left(x_o - \frac{\Delta}{2} \leq x < x_o + \frac{\Delta}{2}\right)$ and for any $x_o = k \cdot \Delta$, then:

$$E_q = \int_{x=x_{MIN}}^{x_{MAX}} E\left[\frac{(y-x)^2}{x}\right] \cdot p(x) \cdot dx = \quad \text{Equation 15}$$

$$\int_{x=-\frac{\Delta}{2}}^{\frac{\Delta}{2}} \left(1 - \left(\frac{x}{\Delta}\right)\right) \cdot \left(\frac{x}{\Delta}\right)^2 + \left(\frac{x}{\Delta}\right) \cdot \left(1 - \left(\frac{x}{\Delta}\right)\right)^2 \cdot \frac{1}{\Delta} \cdot dx = \frac{\Delta^2}{6}$$

Thus, when Equation 15 is compared to Equation 4, it can be seen that the noise power has doubled (e.g. +3 dB) at an output of the DAC 202. However, as will now become apparent, such increased noise is capable of being more easily filtered for removal, since it is independent of the input signal [i.e. it is independently and identically distributed (IID) noise, etc.] and is thus predictable (based on the known output of the random number generator 204).

Following is a proof of a random DAC quantization noise autocorrelation function. Specifically, the following proof establishes that, for the DAC 202 of FIG. 2, any DAC quantization noise will be white noise, regardless of the character of the input signal.

for $(n=m)$ $E=((q(n) \cdot q(m))|x(n),x(m))=E(q(n)^2|x(n))$     Equation 16:

where:
n and m are different sample indexes (in time, different antennas, etc.).

for (n ≠ m)                                                                 Equation 17

$$E = ((q(n) \cdot q(m)) \mid x(n), x(m))$$

$$= \begin{bmatrix} \text{fractional}\left(\frac{|x(n)|}{\Delta}\right) \cdot \text{fractional}\left(\frac{|x(m)|}{\Delta}\right) \cdot \left(1 - \text{fractional}\left(\frac{|x(n)|}{\Delta}\right)\right) \cdot \left(1 - \text{fractional}\left(\frac{|x(m)|}{\Delta}\right)\right) - \\ \text{fractional}\left(\frac{|x(n)|}{\Delta}\right) \cdot \left(1 - \text{fractional}\left(\frac{|x(m)|}{\Delta}\right)\right) \cdot \left(1 - \text{fractional}\left(\frac{|x(n)|}{\Delta}\right)\right) \cdot \text{fractional}\left(\frac{|x(m)|}{\Delta}\right) - \\ \left(1 - \text{fractional}\left(\frac{|x(n)|}{\Delta}\right)\right) \cdot \text{fractional}\left(\frac{|x(m)|}{\Delta}\right) \cdot \text{fractional}\left(\frac{|x(n)|}{\Delta}\right) \cdot \left(1 - \text{fractional}\left(\frac{|x(m)|}{\Delta}\right)\right) \\ \left(1 - \text{fractional}\left(\frac{|x(n)|}{\Delta}\right)\right) \cdot \left(1 - \text{fractional}\left(\frac{|x(m)|}{\Delta}\right)\right) \cdot \text{fractional}\left(\frac{|x(n)|}{\Delta}\right) \cdot \text{fractional}\left(\frac{|x(m)|}{\Delta}\right) \end{bmatrix}$$

$$= 0$$

where:
x is a DAC input signal;
y is a DAC output signal;
$\Delta$ is a DAC step;
q is DAC quantization noise q=y−x; fractional(fract) is an operation, where, for example: fract(5.7)=0.7 fract(−5.7)=−0.7; and
E[ ] is an expectation function.

In one embodiment, the random DAC quantization noise autocorrelation in connection with the DAC 202 may be represented as follows, in summarized form:

$$E[q(n) \cdot q(m)] = \int \int E[(q(n) \cdot q(m) \mid x(n), x(m))] \cdot P(x(n), x(m)) \cdot dx(n) \cdot dx(m) \qquad \text{Equation 18}$$

$$E[q(n) \cdot q(m)] = \begin{cases} E_q & \text{If } (k = m) \\ E[q(k)] \cdot E[q(m)] = 0 & \text{Else } (k \neq m) \end{cases} \qquad \text{Equation 19}$$

where:
n and m are different sample indexes (in time, different antennas, etc.);
E[ ] is a random number expectation;
q is DAC quantization noise q=y−x; and
$E_q$ is quantization noise power.

Thus, in summary, as mentioned earlier (during reference to the comparison of Equation 4 and Equation 15), for a larger number of DAC bits, quantization noise energy of the random DAC may be 3 db higher than quantization noise energy of a regular DAC, as indicated below:

$$E[q_0^2] = \frac{\Delta^2}{12}, \text{ versus} \qquad \text{Equation 20}$$

$$E[q_{RND}^2] = \frac{\Delta^2}{6} \qquad \text{Equation 21}$$

where:
$q_0$ is conventional DAC quantization noise;
$q_{RND}$ is random DAC quantization noise;
$\Delta$ is a DAC step; and
E[ ] is a random number expectation.

With that said, a regular DAC spectrum may depend on an input signal, while the random DAC quantization noise is white and is therefore more easily removed, as will now be established.

Figure 4:
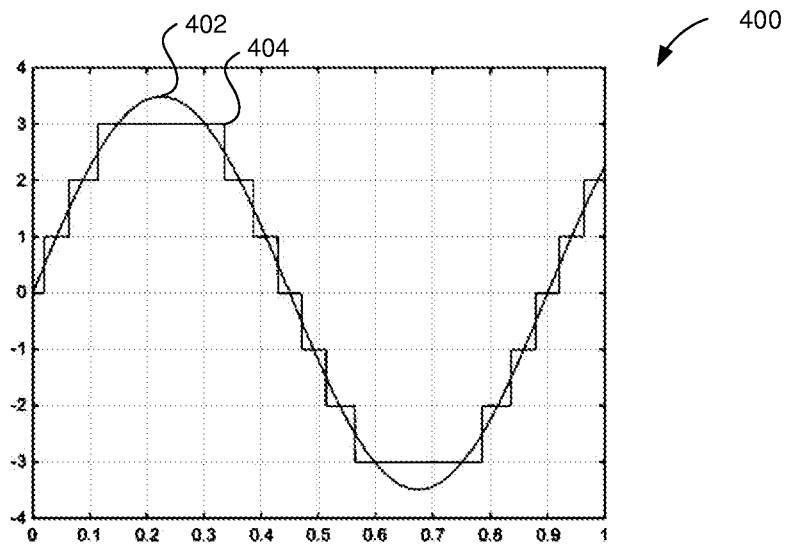
FIG. 4 illustrates a first plot showing an input signal versus an output signal of a 3-bit regular quantizer, and a second plot showing an input signal versus an output signal of a 3-bit random quantizer, in accordance with one embodiment.
Figure 4:
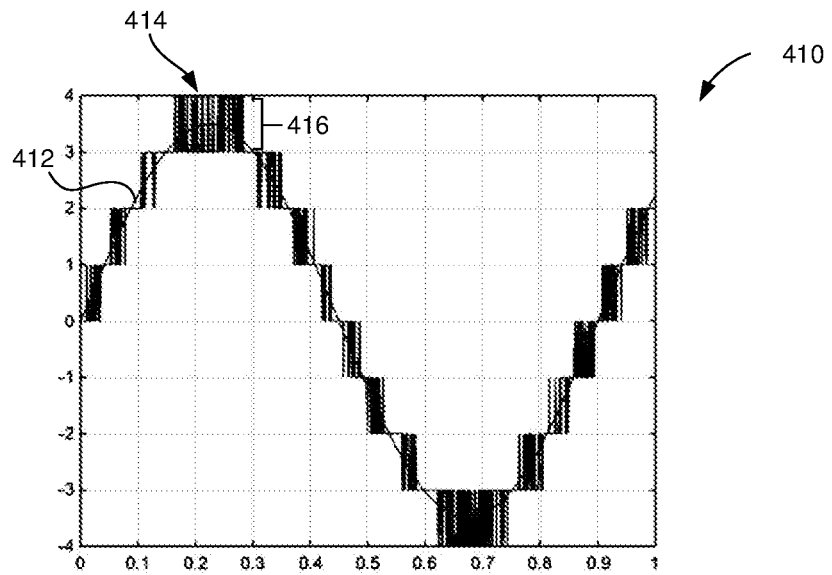

FIG. 4 illustrates a first plot 400 showing an input signal 402 versus an output signal 404 of a 3-bit regular quantizer, and a second plot 410 showing an input signal 412 versus an output signal 414 of a 3-bit random quantizer, in accordance with one embodiment. As shown, the output signal 414 of the 3-bit random quantizer includes a uniform jitter 416 that spans a magnitude of one (1).

Figure 5:
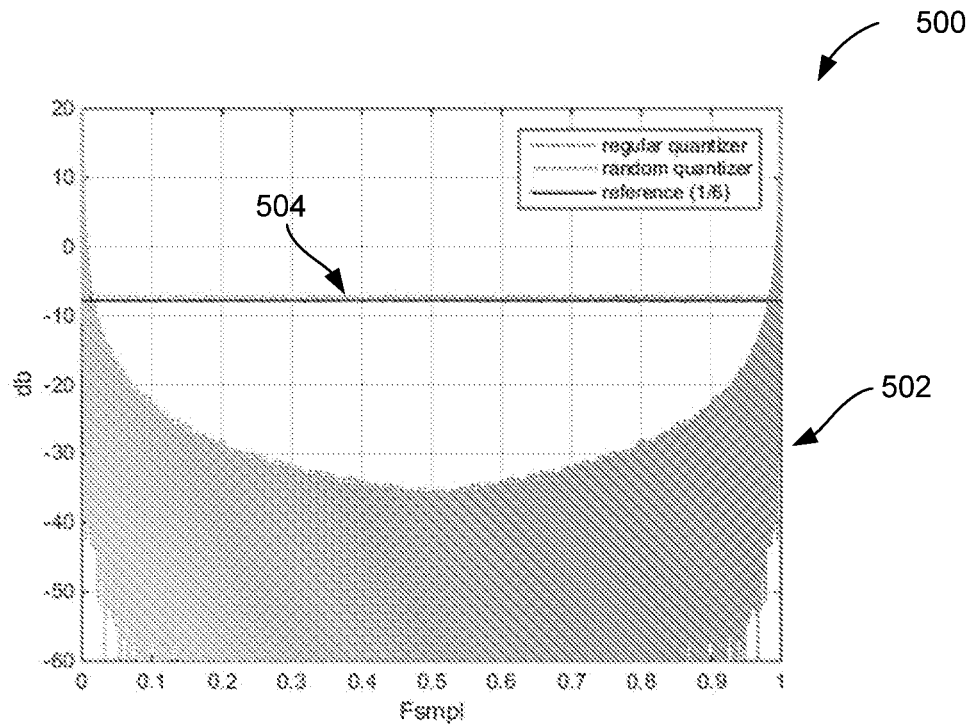
FIG. 5 illustrates a first plot showing a first power spectrum of a 3-bit regular quantizer DAC versus a second power spectrum of a 3-bit random quantizer DAC, in accordance with one embodiment.
Figure 5:
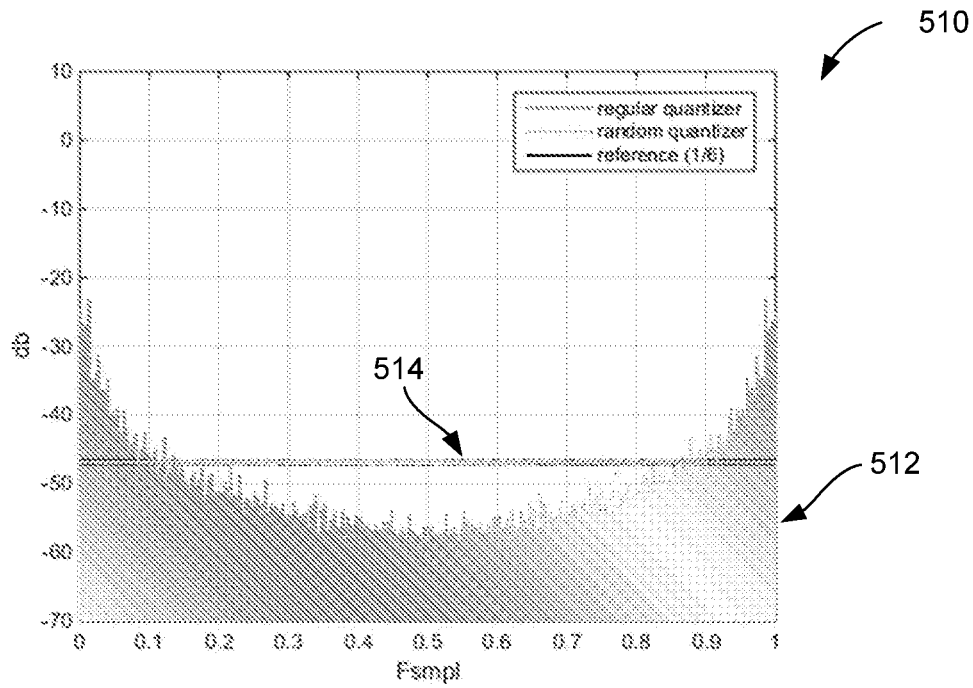

FIG. 5 illustrates a first plot 500 showing a first power spectrum 502 of a 3-bit regular quantizer DAC versus a second power spectrum 504 of a 3-bit random quantizer DAC, in accordance with one embodiment. Also shown is a second plot 510 showing a first power spectrum 512 of a 8-bit regular quantizer DAC versus a second power spectrum 514 of a 8-bit random quantizer DAC. As shown, a relative effectiveness of the random quantizer DAC decreases as the bit level increases. For example, while not shown, a difference between a regular and random DAC may be insignificant as the DAC bit level approaches 16. Further, a reference level (1/6) is included in order to evidence (through simulation) that the random DAC quantization noise energy is equal to $\Delta^2/6$.

In connection with the first plot 500 and the second plot 510, a three (3) bit DAC quantization may be defined as:

$$F_0 = \frac{1.111}{1024} \cdot F_{SMPL} \qquad \text{Equation 22}$$

where:
$F_0$ is input signal frequency; and
$F_{SMPL}$ is DAC sampling frequency.

Figure 6:
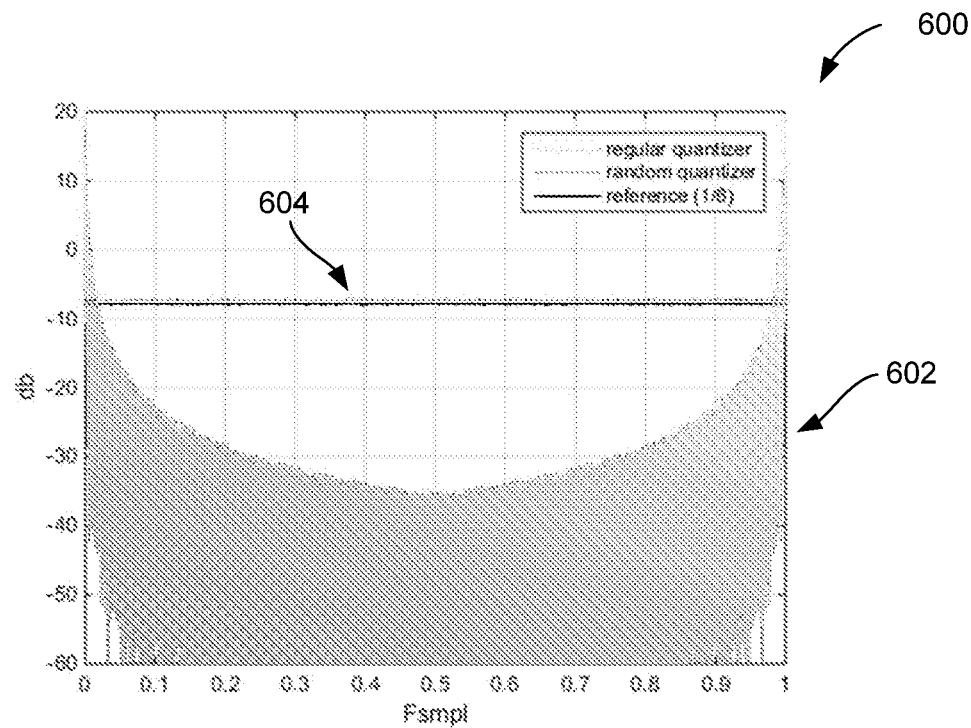
FIG. 6 illustrates a first plot showing a first power spectrum of a 3-bit regular quantizer DAC versus a second power spectrum of a 3-bit random quantizer DAC, in accordance with one embodiment.
Figure 6:
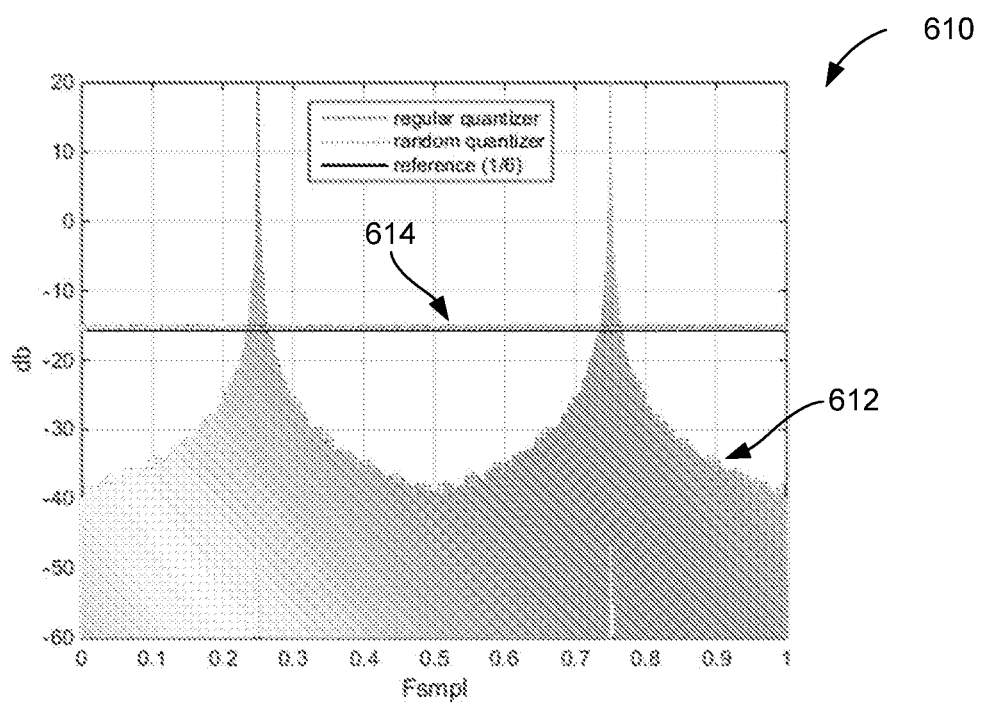

FIG. 6 illustrates a first plot 600 showing a first power spectrum 602 of a 3-bit regular quantizer DAC versus a second power spectrum 604 of a 3-bit random quantizer DAC, in accordance with one embodiment. Also shown is a second plot 610 showing a first power spectrum 612 of a 3-bit regular quantizer DAC versus a second power spectrum 614 of a 3-bit random quantizer DAC, at a different frequency. Further, a reference level (1/6) is included in order to evidence (through simulation) that the random DAC quantization noise energy is equal to $\Delta^2/6$.

In connection with the second plot 610, a three (3) bits DAC quantization noise power spectrum may be defined as:

$$F_0 = \frac{257.1111}{1024} \cdot F_{SMPL} \qquad \text{Equation 23}$$

where:
$F_0$ is input signal frequency; and
$F_{SMPL}$ is DAC sampling frequency.

Figure 7:
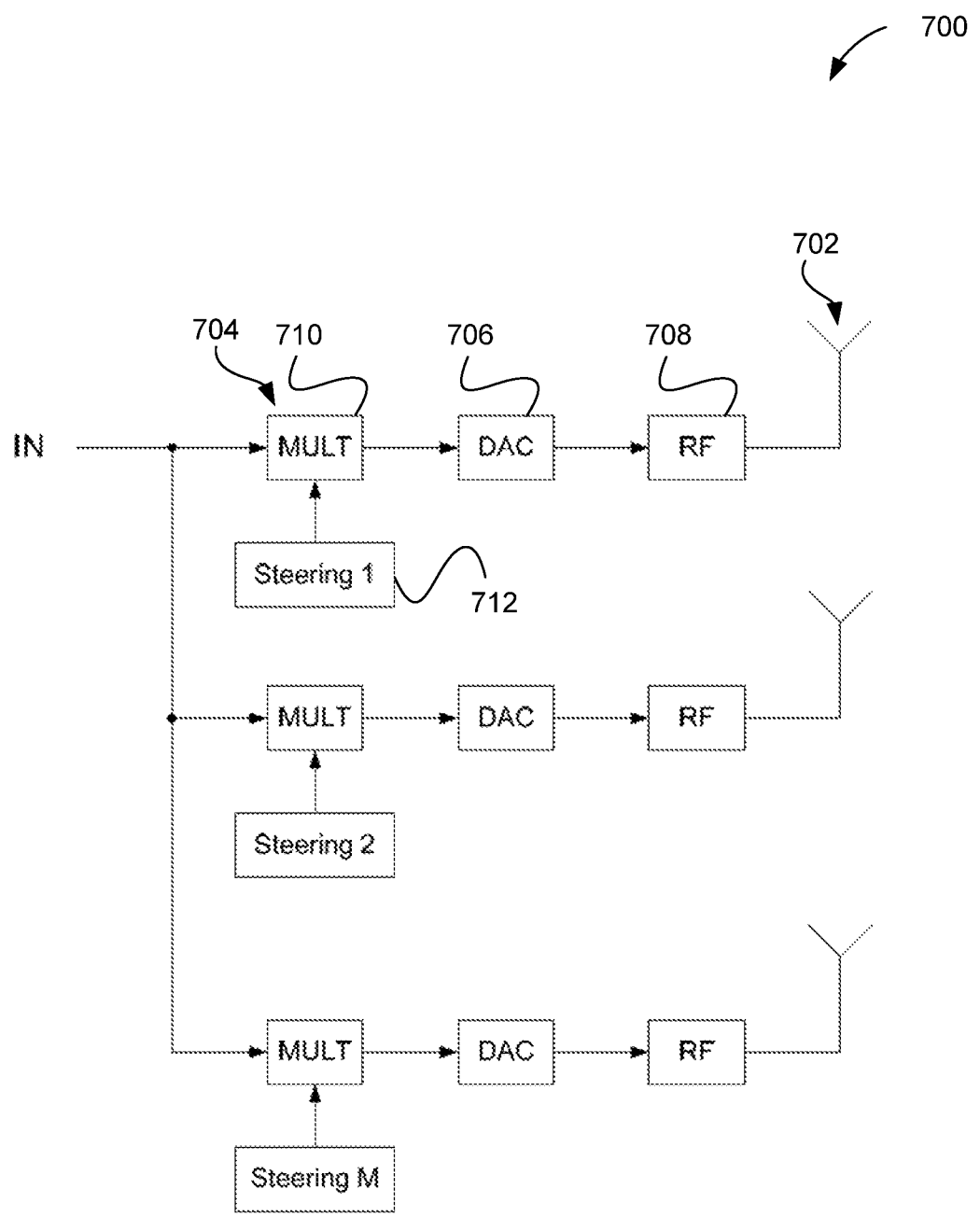
FIG. 7 illustrates a massive multiple-input-multiple-output (MIMO)-capable system, in accordance with another embodiment.

FIG. 7 illustrates a massive MIMO-capable system 700, in accordance with another embodiment. As an option, the system 700 may be implemented in the context of any one or more of the embodiments set forth in any previous and/or subsequent figure(s) and/or description thereof. However, it is to be appreciated that the system 700 may be implemented in the context of any desired environment.

As shown, a plurality of antennas 702 of the massive MIMO-capable system 700 are shown to each be equipped with supporting circuitry 704. Such supporting circuitry 704 may include a random DAC 706 that feeds a radio frequency (RF) transceiver 708 and is fed by a multiplier 710 that controls a signal being input to the random DAC 706, under the control of a steering module 712.

In various embodiments, a number of bits used in connection with the random DAC 706 may be set in a manner that is inversely proportional to a number of antennas of the massive MIMO-capable system 700. For example, as the number of antennas used is increased, a lower-bit random DAC 706 may be employed, thus affording cost savings.

Thus, the quantization noise in connection with each of the antennas 702 may be different, based on the specific white noise that is added via the random DAC 706. As an option, the injection of the different white noise may be configured to reduce an overall amount of quantization noise.

Thus, in one embodiment, massive MIMO beam steering of the massive MIMO-capable system 700 may be reflected by the following:

$$\text{Steering}(m,\alpha) = \exp(j \cdot \pi \cdot m \cdot \sin(\alpha)) \quad \text{Equation 24}$$

$$y(m,n) = \text{DAC}_m(\text{Steering}(m,\alpha) \cdot x(n)) \quad \text{Equation 25}$$

where:
y(m, n) is a DAC m output signal at time n;
x(n) is a signal sent towards direction α;
Steering(m, α) is a steering function towards direction α at antenna m;
sin( ) is a sine function;
exp(j*x)=cos(x)+j*sin(x);
j is complex 1 (j=sqrt(−1)); and
α is a steering direction.

In one embodiment, massive MIMO beam steering (at different angles) may be represented by the following:

$$\text{Steering}(m, \alpha = 0^0) = \langle 1, 1, 1, 1 \ldots, 1, 1, 1, 1\rangle \quad \text{Equation 26}$$

$$\text{Steering}(m, \alpha = 30^0) = \left\langle \frac{1}{\sqrt{2}}, \frac{1}{\sqrt{2}}, -\frac{1}{\sqrt{2}}, -\frac{1}{\sqrt{2}} \ldots, \frac{1}{\sqrt{2}}, \frac{1}{\sqrt{2}}, -\frac{1}{\sqrt{2}}, -\frac{1}{\sqrt{2}}\right\rangle \quad \text{Equation 27}$$

$$\text{Steering}(m, \alpha = -30^0) = \left\langle -\frac{1}{\sqrt{2}}, -\frac{1}{\sqrt{2}}, \frac{1}{\sqrt{2}}, \frac{1}{\sqrt{2}} \ldots, -\frac{1}{\sqrt{2}}, -\frac{1}{\sqrt{2}}, \frac{1}{\sqrt{2}}, \frac{1}{\sqrt{2}}\right\rangle \quad \text{Equation 28}$$

$$\text{Steering}(m, \alpha = 90^0) = \langle 1, -1, 1, -1 \ldots, 1, -1, 1, -1\rangle \quad \text{Equation 29}$$

Further, massive MIMO quantization noise on a UE may be represented as follows:

$$q(\alpha, n) = \frac{1}{M} \cdot \sum_{m=0}^{M-1} \text{Steering}^*(m, \alpha) \cdot q(m, n) \quad \text{Equation 30}$$

$$q(\alpha, n) = \frac{1}{M} \cdot \sum_{m=0}^{M-1} \text{Steering}^*(m, \alpha) \cdot (\text{Steering}(m, \alpha) \cdot x(n) - DAC(\text{Steering}(m, \alpha) \cdot x(n))) \quad \text{Equation 31}$$

$$q(\alpha, n) = x(n) - \frac{1}{M} \cdot \sum_{m=0}^{M-1} \text{Steering}^*(m, \alpha) \cdot DAC(\text{Steering}(m, \alpha) \cdot x(n)) \quad \text{Equation 32}$$

where M=number of antennas.

It should be noted that, to the extent that any expressions are repeated in the above equations, their definition(s) are the same, unless indicated otherwise.

Figure 8:
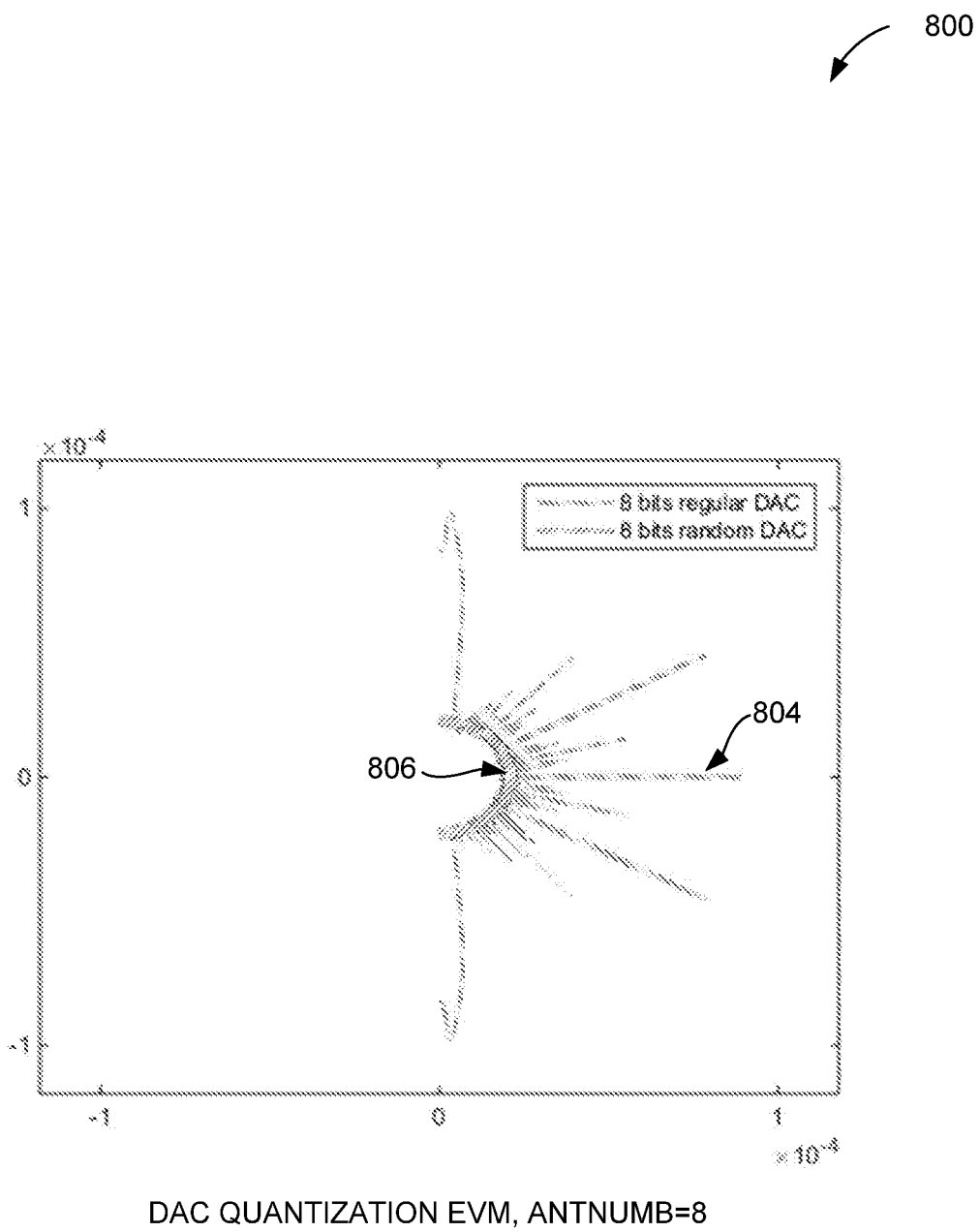
FIG. 8 illustrates a plot showing a massive MIMO (with eight antennas) DAC quantization error vector magnitude (EVM) on user equipment (UE) as a function of UE direction, in accordance with one embodiment.

FIG. 8 illustrates a plot 800 showing a massive MIMO (with eight antennas) DAC quantization error vector magnitude (EVM) on a UE as a function of UE direction, in accordance with one embodiment. As shown, an 8-bit regular DAC quantization EVM 804 is much more problematic than an 8-bit random DAC quantization EVM 806. Specifically, the 8-bit random DAC quantization exhibits a more evenly (i.e. uniform) distributed power (albeit more overall).

Figure 9:
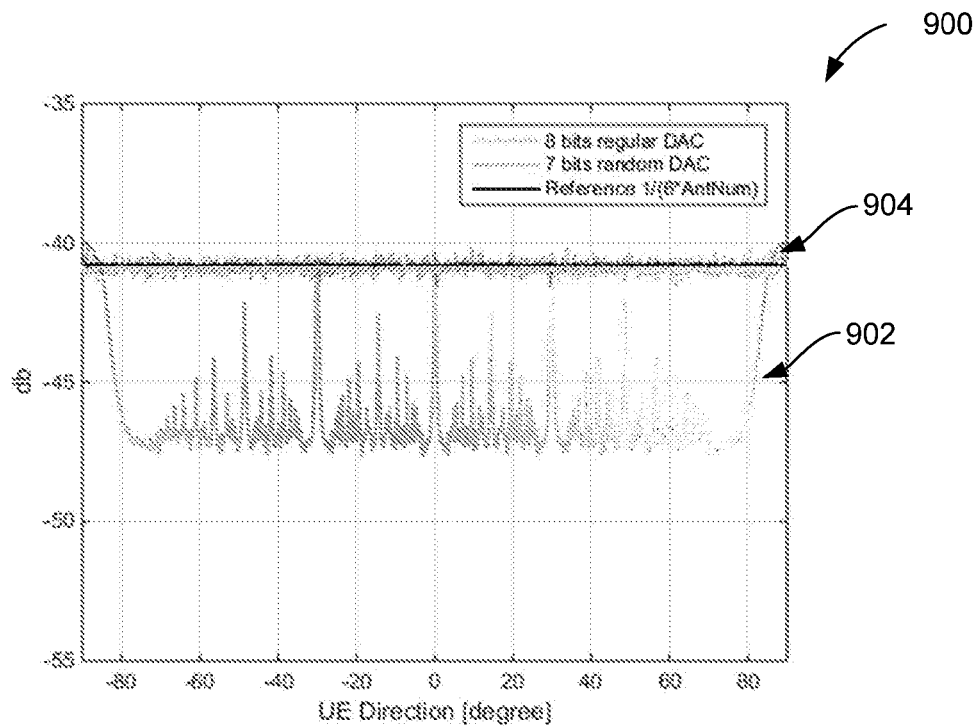
FIG. 9 illustrates a first plot showing a massive MIMO (with 8 antennas) DAC quantization EVM on a UE as a function of UE direction, and a second plot showing a massive MIMO (with 32 antennas) DAC quantization EVM on a UE as a function of UE direction, in accordance with one embodiment.
Figure 9:
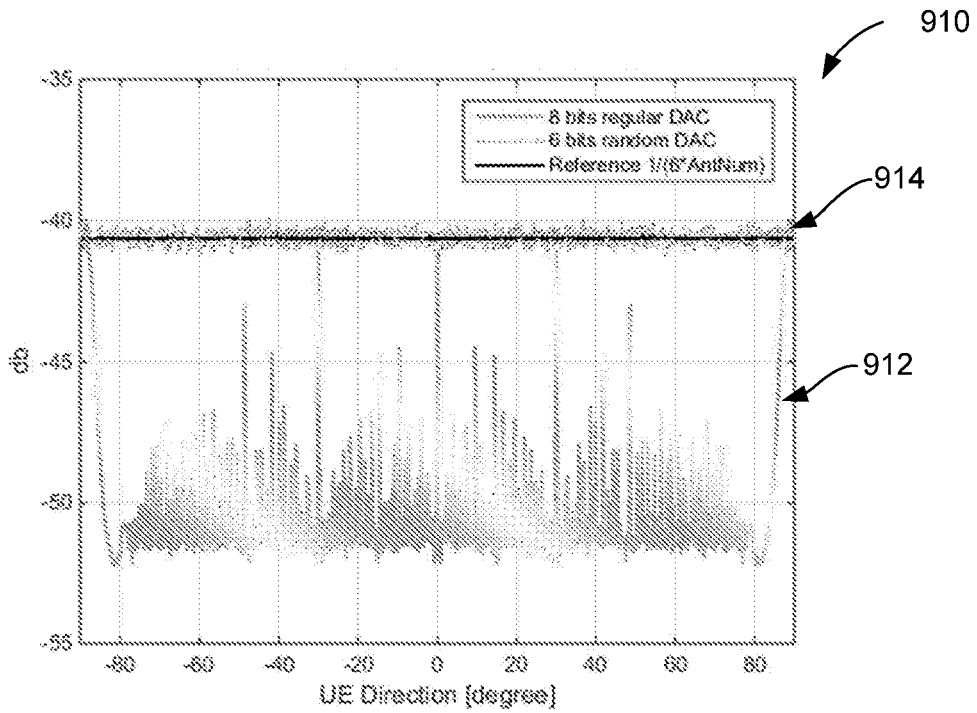

FIG. 9 illustrates a first plot 900 showing a massive MIMO (with 8 antennas) DAC quantization EVM on a UE as a function of UE direction, and a second plot 910 showing a massive MIMO (with 32 antennas) DAC quantization EVM on a UE as a function of UE direction, in accordance with one embodiment. With respect to the first plot 900, an 8-bit regular DAC quantization EVM 902 is much more problematic than a 7-bit random DAC quantization EVM 904. With respect to the second plot 910, an 8-bit regular DAC quantization EVM 912 is much more problematic than a 6-bit random DAC quantization EVM 914.

Figure 10:
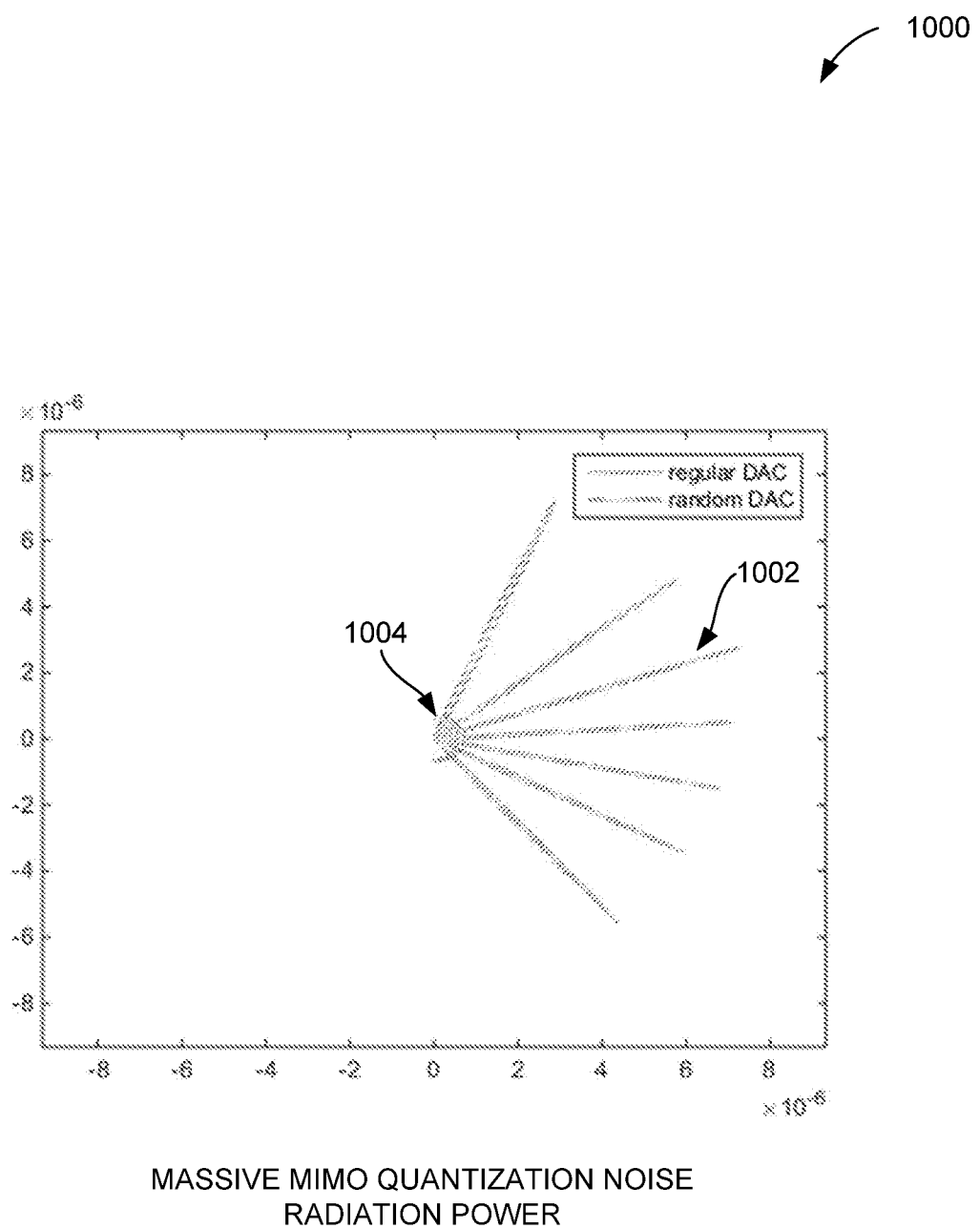
FIG. 10 illustrates a plot showing massive MIMO quantization noise radiation power, in accordance with one embodiment.

FIG. 10 illustrates a plot 1000 showing massive MIMO quantization noise radiation power, in accordance with one embodiment. As shown, the plot 1000 shows that, an 8-bit regular DAC (with 256 antennas) exhibits quantization noise radiation power 1002 that is more problematic as compared to quantization noise radiation power 1004 exhibited by a 8-bit random DAC.

Figure 11:
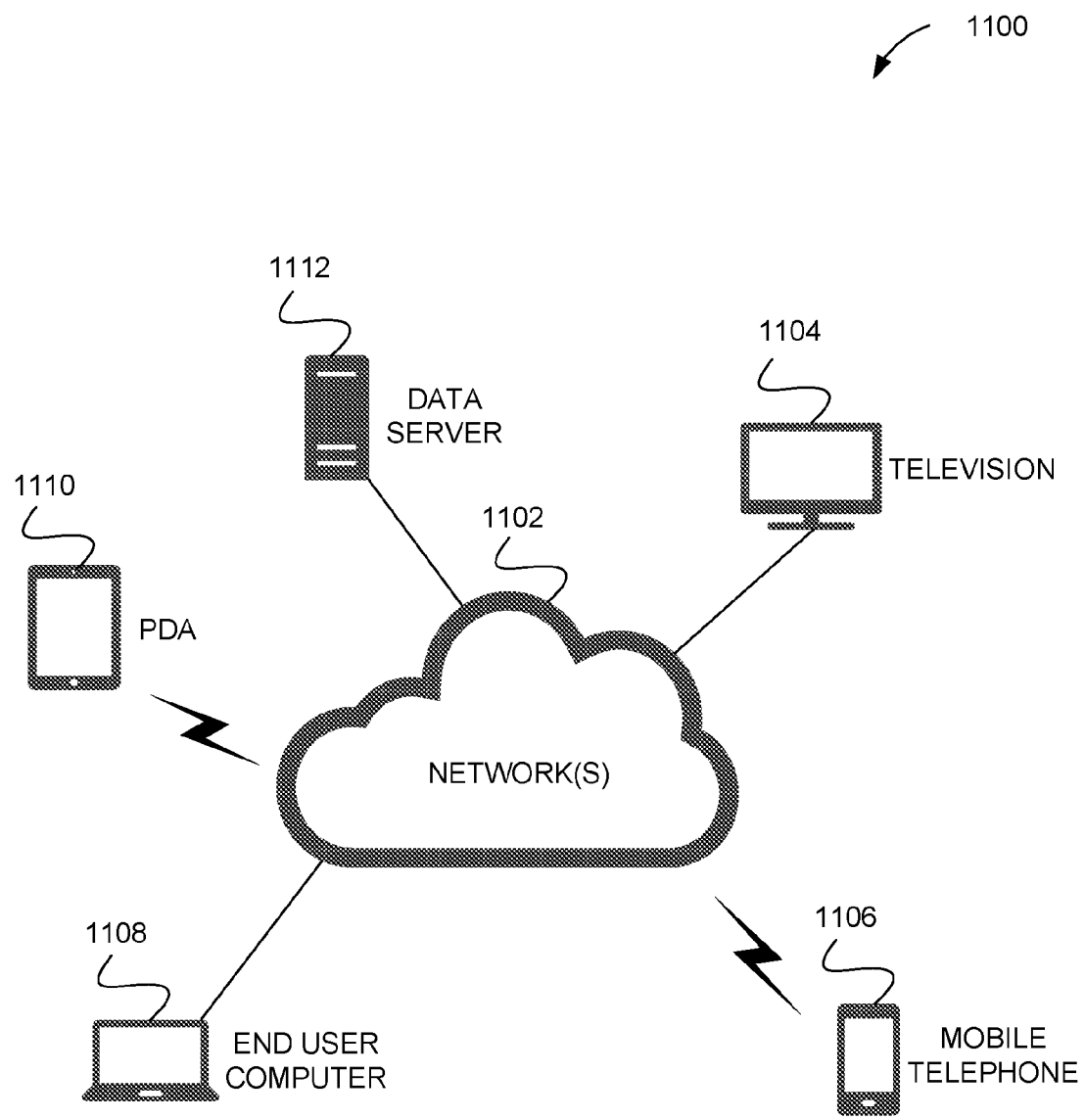
FIG. 11 illustrates a network architecture, in accordance with one embodiment.

FIG. 11 illustrates a network architecture 1100, in accordance with one embodiment. As shown, at least one network 1102 is provided. In various embodiments, any one or more of the features disclosed in the previous figures may be incorporated into any of the components of the at least one network 1102.

In the context of the present network architecture 1100, the network 1102 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 1102 may be provided.

Coupled to the network 1102 is a plurality of devices. For example, a server computer 1112 and an end user computer 1108 may be coupled to the network 1102 for communication purposes. Such end user computer 1108 may include a desktop computer, lap-top computer, and/or any other type of logic. Still yet, various other devices may be coupled to the network 1102 including a personal digital assistant (PDA) device 1110, a mobile phone device 1106, a television 1104, etc.

Figure 12:
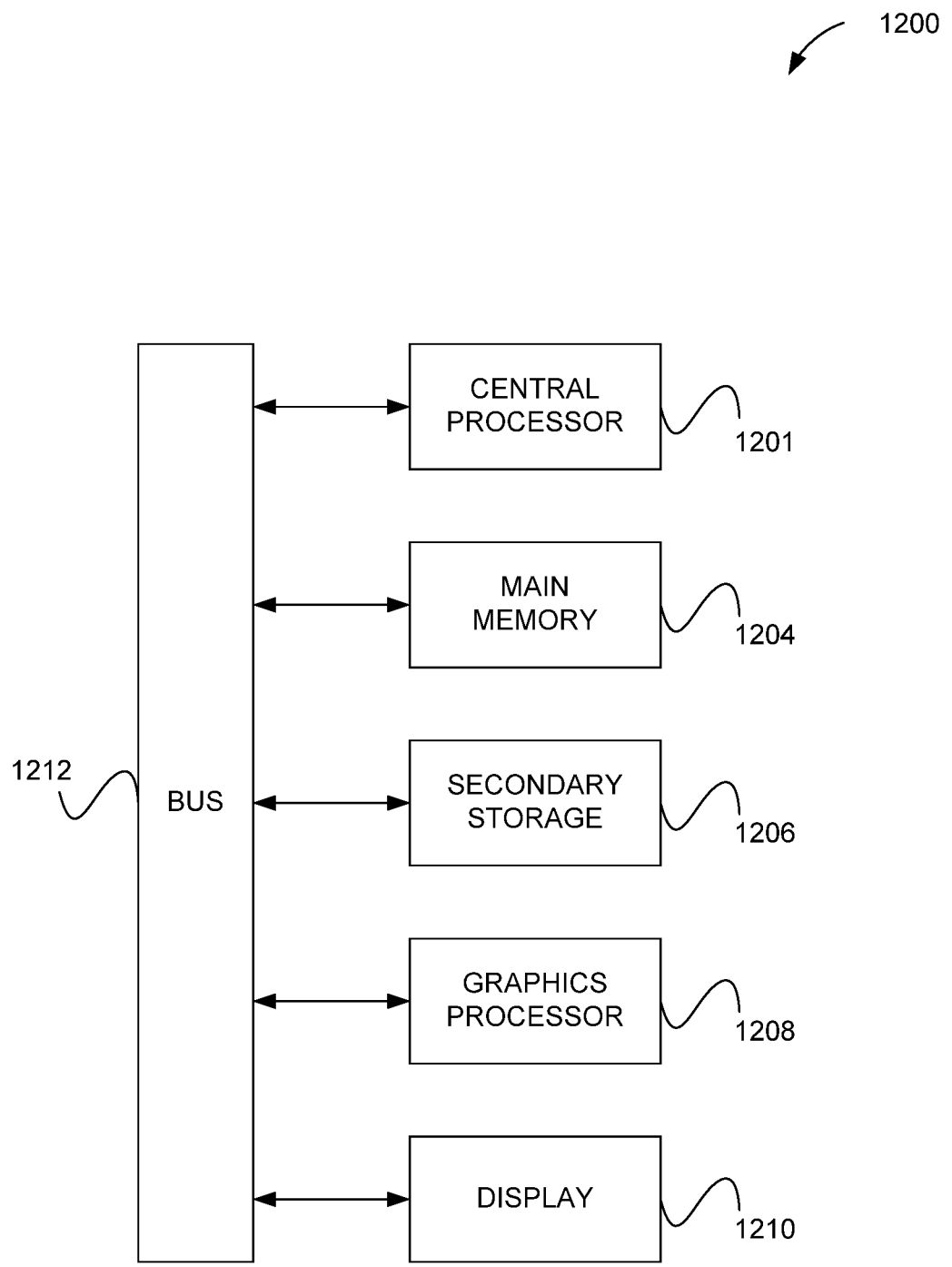
FIG. 12 illustrates an exemplary system, in accordance with one embodiment.

FIG. 12 illustrates an exemplary system 1200, in accordance with one embodiment. As an option, the system 1200 may be implemented in the context of any of the devices of the network architecture 1100 of FIG. 11. However, it is to be appreciated that the system 1200 may be implemented in any desired environment.

As shown, a system 1200 is provided including at least one central processor 1202 which is connected to a bus 1212. The system 1200 also includes main memory 1204 [e.g., hard disk drive, solid state drive, random access memory (RAM), etc.]. The system 1200 also includes a graphics processor 1208 and a display 1210.

The system 1200 may also include a secondary storage 1206. The secondary storage 1206 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 1204, the secondary storage 1206, and/or any other memory, for that matter. Such computer programs, when executed, enable the system 1200 to perform various functions (as set forth above, for example). Memory 1204, secondary storage 1206 and/or any other storage are possible examples of non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
   a plurality of antennas;
   a plurality of supporting circuitry coupled to the plurality of antennas,
   wherein each of the supporting circuitry comprises:
   a combiner that receives an input signal and combines the input signal with a particular signal for at least one of the plurality of antennas of a multiple-input-multiple-output (MIMO) system;
   a steering module circuitry that is coupled to the combiner for controlling the combining of the input signal with the particular signal; and
   a digital to analog converter coupled to the combiner, wherein the digital to analog converter receives the combined signal from the combiner and outputs an output signal, wherein the output signal comprises a quantization noise that is independent of the input signal;
   wherein the particular signal for each of the combiners is generated utilizing a single random signal generator.

2. The apparatus of claim 1, wherein each of the supporting circuitry further comprises:
   a filter coupled to the digital to analog converter that filters the quantization noise from the output signal.

3. The apparatus of claim 1,
   wherein the random signal generator is coupled to each of the combiners for use in generating the particular signal for each of the combiners.

4. The apparatus of claim 3, wherein the random signal generator has a uniform distribution.

5. The apparatus of claim 1, wherein the combiner adds the input signal with the particular signal.

6. The apparatus of claim 1, wherein the combiner multiplies the input signal with the particular signal.

7. The apparatus of claim 1, wherein the digital to analog converter is a single bit digital to analog converter.

8. A multiple-input-multiple-output (MIMO) system, comprising:
   a plurality of antennas coupled to a plurality of supporting circuitry, wherein each of the supporting circuitry comprises:
   a combiner that receives an input signal and combines the input signal with a particular signal,
   circuitry associated with a steering module that is coupled to the combiner for controlling the combining of the input signal with the particular signal, and
   a digital to analog converter coupled to the combiner, wherein the digital to analog converter receives the combined signal from the combiner and outputs an output signal, wherein the output signal comprises a quantization noise that is independent of the input signal;
   wherein the MIMO system is configured such that the particular signal for each of the plurality of combiners of the MIMO system is generated by a single random signal generator.

9. The MIMO system of claim 8, wherein each of the supporting circuitry further comprises:
   a radio frequency transceiver coupled to the digital to analog converter for emitting a radio frequency signal based on the output signal.

10. The MIMO system of claim 8, wherein the MIMO system is a massive MIMO system.

11. The MIMO system of claim 8, wherein the MIMO system is configured such that each particular signal for each of the plurality of combiners has a different phase.

12. The MIMO system of claim 8, wherein an output of the steering module produces a signal characterized by the following equation:

$$\text{Steering}(m,\alpha) = \exp(j \cdot \pi m \cdot \sin(\alpha)), \text{ where:}$$

Steering(m, α) is a steering function towards direction α at antenna m, where m>0;
sin( ) is a sine function;
exp(j*x)=cos(x)+j*sin(x);
j is complex 1; and
α is a steering direction.

13. The MIMO system of claim 12, wherein the output signal is characterized by the following equation:

$$y(m,n) = \text{DAC}_m(\text{Steering}(m,\alpha) \cdot x(n)), \text{ where:}$$

y(m, n) is a DAC m output signal at time n; and
x(n) is a signal sent towards direction α.

14. A method for processing signals in a multiple-input-multiple-output (MIMO) system comprising a plurality of antennas coupled to a plurality of supporting circuitry, comprising:
   in each of the plurality of supporting circuitry:
   receiving an input signal for a digital to analog converter;
   combining the input signal with a particular signal, wherein a steering module controls the combining of the input signal with the particular signal;
   wherein the particular signal for each of the plurality of antennas of the MIMO system is generated by a single random signal generator;
   transmitting the combined signal to the digital to analog converter; and
   outputting an output signal from the digital to analog converter that includes quantization noise that is independent of the input signal.

15. The method of claim 14, wherein the particular signal is white noise.

16. The method of claim 14, wherein the particular signal is uniformly distributed.

17. The method of claim 14, wherein the quantization noise is independent, identically distributed (IID).

18. The method of claim 14, wherein the quantization noise is random quantization noise.

19. The method of claim 14, and further comprising filtering the quantization noise of the output signal of the digital to analog converter.

\* \* \* \* \*